United States Patent
Bennett

(10) Patent No.: US 10,742,213 B2
(45) Date of Patent: Aug. 11, 2020

(54) NON-CONTACT PROXIMITY SENSOR

(71) Applicant: Lumitex, Inc., Strongsville, OH (US)

(72) Inventor: Emeric S. Bennett, Chardon, OH (US)

(73) Assignee: Lumitex, Inc., Strongsville, OH (US)

( * ) Notice: Subject to any disclaimer, the term of this patent is extended or adjusted under 35 U.S.C. 154(b) by 182 days.

(21) Appl. No.: 16/009,552

(22) Filed: Jun. 15, 2018

(65) Prior Publication Data
US 2018/0367138 A1    Dec. 20, 2018

Related U.S. Application Data

(60) Provisional application No. 62/522,346, filed on Jun. 20, 2017.

(51) Int. Cl.
*H03K 17/955* (2006.01)
*G01D 5/24* (2006.01)
*H03K 17/945* (2006.01)
*H03K 17/96* (2006.01)

(52) U.S. Cl.
CPC ............. *H03K 17/955* (2013.01); *G01D 5/24* (2013.01); *H03K 2017/9455* (2013.01); *H03K 2017/9613* (2013.01); *H03K 2217/960705* (2013.01); *H03K 2217/960765* (2013.01)

(58) Field of Classification Search
CPC .......... H03K 17/955; H03K 2017/9455; H03K 2017/9613; H03K 2217/960705; H03K 2217/960765; G01R 27/22; G01D 5/24
USPC .......... 324/637–671, 500, 600, 76.11, 76.26, 324/424–444, 447, 515, 559
See application file for complete search history.

(56) References Cited

U.S. PATENT DOCUMENTS

| | | | |
|---|---|---|---|
| 5,166,679 A * | 11/1992 | Vranish | B25J 13/086 324/687 |
| 5,337,353 A | 8/1994 | Boie | |
| 2018/0136260 A1 * | 5/2018 | Rodriguez | G01R 1/22 |
| 2019/0072632 A1 * | 3/2019 | Huber | G01R 19/00 |

* cited by examiner

*Primary Examiner* — Melissa J Koval
*Assistant Examiner* — Trung Nguyen
(74) *Attorney, Agent, or Firm* — Renner, Otto, Boisselle & Sklar, LLP

(57) ABSTRACT

A low-power non-contact proximity sensor with improved sensitivity. In particular, the non-contact proximity sensor includes a capacitive sensor decoupled from a surrounding environment by a guard ring. Both the capacitive sensor and the guard ring are driven by a direct current (DC) power source, with the guard ring driven based on feedback from the voltage applied to the capacitive sensor.

17 Claims, 3 Drawing Sheets

NON-CONTACT PROXIMITY SENSOR

RELATED APPLICATIONS

This application claims priority to U.S. Application No. 62/522,346, filed Jun. 20, 2017, which is incorporated herein by reference.

TECHNICAL FIELD

The present invention relates generally to proximity sensors and in particular to capacitive sensors including a guard ring.

BACKGROUND

Capacitive proximity sensors are widely used in various applications and are generally known. Systems using capacitive proximity sensors typically measure the capacitance (or change in capacitance) of a sensing electrode as an object being sensed moves in relation to the electrode. Typically, the sensing electrode is connected to an alternating current (AC) or radio frequency (RF) source and the current to the electrode is monitored to detect capacitance changes. Capacitive sensors typically signal movement of an object by controlling the output frequency of an oscillator.

SUMMARY

Currently, capacitive sensors do not sufficiently control stray capacitance and/or leakage currents. Consequently, capacitive sensors do not have sufficient sensitivity for many applications. Additionally, the inclusion of AC sources and/or oscillators results in higher electrical power requirements, preventing the creation of low power proximity capacitive sensors.

The present invention provides a low-power non-contact proximity sensor with improved sensitivity. In particular, the non-contact proximity sensor includes a capacitive sensor decoupled from a surrounding environment by a guard ring. Both the capacitive sensor and the guard ring are driven by a direct current (DC) power source, with the guard ring driven based on feedback from the voltage applied to the capacitive sensor.

According to one aspect, there is provided a non-contact proximity sensor configured to provide an output indicating movement of an object relative to the proximity sensor. The proximity sensor includes a guard ring, a capacitive sensing electrode, and circuitry. The capacitive sensing electrode is decoupled from a surrounding environment by the guard ring. The circuitry is configured to apply a direct current (DC) voltage to the capacitive sensing electrode. The DC voltage applied to the capacitive sensing electrode charges the capacitive sensing electrode to a voltage potential. The circuitry is also configured to apply a voltage to the guard ring based on the voltage applied to the capacitive sensing electrode using feedback. The feedback has a gain between zero and one. The capacitive sensing electrode is configured such that the movement of the object relative to the capacitive sensing electrode changes a charge on the capacitive sensing electrode. The circuitry is configured to provide the output having a first value when the object does not move relative to the capacitive sensing electrode and another value when the object moves relative to the capacitive sensing electrode.

Alternatively or additionally, the circuitry includes a feedback op amp incorporating the feedback, the feedback op amp is configured to receive as an input a voltage of the capacitive sensing electrode, and an output of the feedback op amp is applied to the guard ring.

Alternatively or additionally, the output of the feedback op amp represents the voltage on the capacitive sensing electrode.

Alternatively or additionally, the output of the feedback op amp differs based on a size of the object that moves relative to the capacitive sensing electrode.

Alternatively or additionally, the change in charge on the capacitive sensing electrode caused by the movement of the object results in a change in voltage at the input of the feedback op amp.

Alternatively or additionally, the change in voltage at the input of the feedback op amp appears at the output of the feedback op amp.

Alternatively or additionally, the circuitry further includes a comparator comprising a first input, a second input, and an output. The comparator is configured to receive a voltage bias at the first input of the comparator, receive the output of the feedback op amp at the second input of the comparator, output a first voltage when the object does not move relative to the capacitive sensing electrode, and output a second voltage when the object moves relative to the capacitive sensing electrode.

Alternatively or additionally, the second voltage is output when the object moves away from the capacitive sensing electrode.

Alternatively or additionally, the circuitry further includes a following comparator comprising a first input, a second input, and an output. The following comparator is configured to receive the output of the feedback op amp at the first input of the following comparator, receive a voltage bias at the second input of the following comparator, output a first voltage when the object does not move relative to the capacitive sensing electrode, and output a second voltage when the object moves closer to the sensor.

Alternatively or additionally, the voltage bias at the second input of the following comparator differs from the voltage bias at the first input of the comparator.

Alternatively or additionally, the circuitry includes at least one battery configured to supply all electrical power supplied to the guard ring, the capacitive sensing electrode, and the circuitry.

Alternatively or additionally, the proximity sensor also includes a housing containing entirely within an interior volume of the housing the at least one battery, the capacitive sensing electrode, the circuitry, and the guard ring.

Alternatively or additionally, the circuitry outputs a voltage or current when the movement of the object is detected and the outputted voltage or current is applied to a light source, such that the light source emits light upon the movement of the object being detected.

Alternatively or additionally, the capacitive sensing electrode is surrounded on all but one side by the guard ring.

Alternatively or additionally, the non-surrounded side of the capacitive sensing electrode faces a detection direction and the capacitive sensing electrode is sensitive to the movement of the object relative to the sensing direction.

Alternatively or additionally, the processor additionally includes an insulating layer positioned between the capacitive sensing electrode and the guard ring.

Alternatively or additionally, the processor also includes a metallic layer positioned between the capacitive sensing electrode and the guard ring. The metallic layer is configured to reduce sensing of movement from directions other than the sensing direction.

Alternatively or additionally, the circuitry drives the guard ring to have a voltage potential that is less than a voltage potential of the capacitive sensing electrode and within one percent of the voltage potential of the capacitive sensing electrode.

Alternatively or additionally, the circuitry is configured to charge the voltage potential of the capacitive sensing electrode to 1.5 volts.

A number of features are described herein with respect to embodiments of the invention; it will be appreciated that features described with respect to a given embodiment also may be employed in connection with other embodiments.

The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects of the invention in which similar reference numerals are used to indicate the same or similar parts in the various views.

DETAILED DESCRIPTION

The present invention provides a non-contact proximity sensor including a capacitive sensor decoupled from a surrounding environment by a guard ring. The capacitive sensor is driven by a direct current (DC) power source. Voltage is applied to the guard ring using feedback from the voltage applied to the capacitive sensor.

Figure 1:
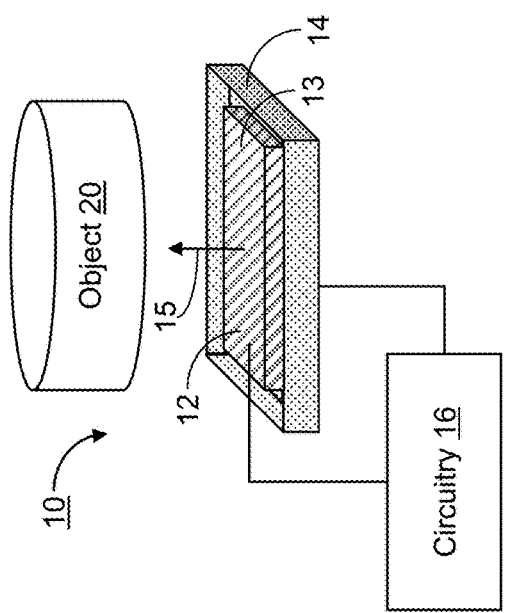
FIG. 1 is a schematic view of an exemplary proximity sensor according to the invention.

Turning to FIG. 1, an exemplary non-contact proximity sensor 10 according to the invention includes a capacitive sensing electrode 12 (also referred to as a capacitive sensor), a guard ring 14, and circuitry 16. The proximity sensor 10 is configured to provide an output indicating movement of an object 20 relative to the proximity sensor 10.

The capacitive sensing electrode 12 is decoupled from a surrounding environment by the guard ring 14. The guard ring 14 decouples the capacitive sensor 12 to reduce parasitic capacitance and leakage current to the surrounding environment. The decoupling is performed by driving the guard ring 14 at approximately the same voltage as the capacitive sensor 12. Consequently, the capacitive sensor 12 is shielded from a nearby ground, such that the capacitance between the capacitive sensor 12 and the surrounding environment is substantially reduced (if not eliminated). Also, driving the guard ring 14 at approximately the same voltage as the capacitive sensor 12 reduces a voltage drop across the guard ring 14.

As will be understood by one of ordinary skill in the art, the surrounding environment refers to objects (including components of the proximity sensor 10) other than the object 20 near to the capacitive sensor 12. For example, if elements of the circuitry 16 are positioned below the capacitive sensor 12, these elements of the circuitry may be considered part of the surrounding environment.

The circuitry 16 applies a direct current (DC) voltage to the capacitive sensor 12, charging the capacitive sensor 12 to a voltage potential. The circuitry 16 also applies a voltage to the guard ring 14 based on the voltage applied to the capacitive sensor 12 using feedback. The feedback has a gain between zero and one. Preferably, the feedback gain is greater than or equal to 0.99. By using a feedback gain close to (but less than) 1.0, the voltage potential of the guard ring 14 may be kept less than, but within one percent of, the voltage potential of the capacitive sensor 12. The feedback gain is not limited to being greater than 0.99, but gain may be between 0.95 and 1.0.

The capacitive sensor 12 may be a thin sheet of conductive material that acts as one electrode of a capacitor with the object 20 providing the other electrode of the capacitor. By applying a DC voltage to the capacitive sensor 12, charge (e.g., a static electric field) is developed on the capacitive sensor 12. Movement of the object 20 relative to the capacitive sensor 12 changes the position of the object relative to the capacitive sensor and this changes the charge on the capacitive sensor 12. For example, capacitance will decrease (charge is removed) when the object 20 moves away from the capacitive sensor 12. The change in charge results in a small amount of current flow (e.g., 1-1000 pico amps) that would ordinarily be lost or obscured by current leakage from the capacitive sensor 12. However, by actively driving the guard ring 14, leakage current flows are significantly reduced or removed from the capacitive sensor 12 and the small current flow caused by movement of the object can be detected.

The object 20 may comprise any object (e.g., metal, plastic, etc.) that can hold an electric charge when in the vicinity of the capacitive sensor 12 (e.g., within 20 mm/cm).

In a preferred low power embodiment, the circuitry 16 charges the voltage potential of the capacitive sensor 12 to 1.5 volts. At this voltage, the proximity sensor 10 may consume approximately 5 microwatts continuously and the proximity sensor 10 may be powered by batteries (as described below).

The circuitry 16 detects the change in charge on the capacitive sensor 12 caused by the object 20 moving, such that the circuitry 16 outputs a particular value when the object moves relative to the capacitive sensor 12. Alternatively, when the object 20 does not move relative to the capacitive sensor 12, the circuitry 16 outputs another value different from the particular value.

Figure 2:
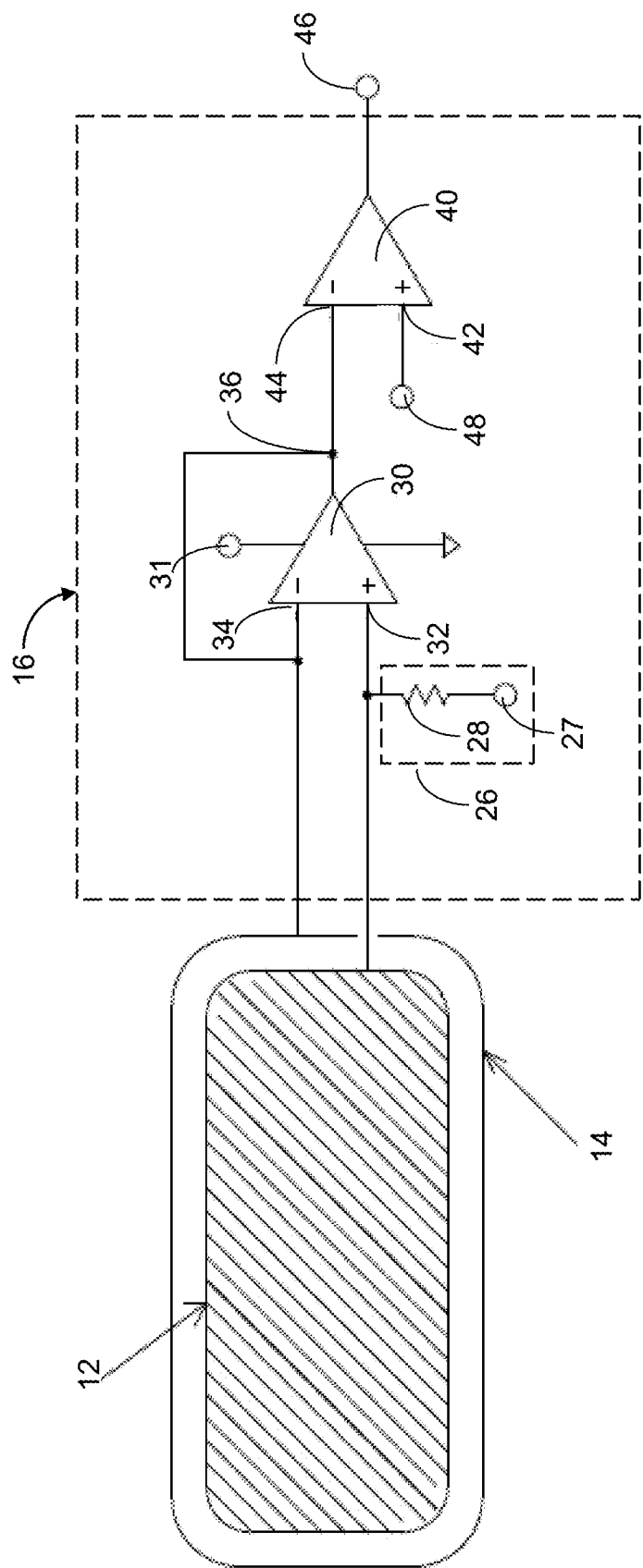
FIG. 2 is a circuit diagram of an exemplary proximity sensor.

Turning to FIG. 2, the circuitry 16 may include a feedback operational amplifier (op amp) 30 incorporating the feedback. The feedback op amp 30 receives as an input 32 (e.g., at a non-inverting input) a voltage of the capacitive sensor 12. For example, a bias source 26 may be connected to the capacitive sensor 12 and the input 32 of the feedback op amp. As shown, the bias source 28 may comprise a voltage source 27 (e.g., 1.5 volts) in series with a resistor 28 (e.g., a 1000 Megaohm). The feedback op amp 30 may additionally be powered by an op amp voltage source 31.

Movement of the object 20 changes the charge on the capacitive sensor 12, resulting in a change in voltage at the input of the feedback op amp 30. For example, current flow (due to movement of the object) results in a voltage across the resistor 28 of the bias source 26. This voltage across the resistor 28 appears at the input 32 of the feedback op amp 30. This change in voltage at the input 32 of the feedback op amp 30 appears at the output 36 of the feedback op amp 30.

In this way, the output 36 of the feedback op amp 30 represents the voltage on the capacitive sensor 12 and this output is applied to the guard ring 14.

The output 36 of the feedback op amp 30 changes depending on a size of the object 20 that moves relative to the capacitive sensor 12. For example, as compared to a smaller version of the same object, larger objects (1) will take more charge with them when moved away from the capacitive sensor 12 and (2) will acquire more charge when moved towards the capacitive sensor 12. This phenomenon makes the proximity sensor 10 more sensitive to movement of large objects than smaller versions of the same object.

The feedback op amp 30 may comprise any op amp having a high input impedance on the input connected to the capacitive sensor 12. For example, the input bias current of the feedback op amp 30 may be approximately 1 femtoamp (fA). The feedback op amp 30 may also buffer the voltage on the capacitive sensor 12.

The feedback op amp 30 additionally includes another input 34 (e.g., an inverting input) that may be connected to the guard ring 14 and the output 36 of the feedback op amp 30.

The feedback loop may be a typical feedback amplifier loop where the output 36 of the feedback op amp 30 is connected to the input 34 of the feedback op amp 30.

The circuitry 16 may also include a comparator 40 having a first input (e.g., a non-inverting input) 42, a second input (e.g., an inverting input) 44, and an output 46. The comparator 40 receives a voltage bias 48 at the first input 42. The comparator 40 also receives the output 36 of the feedback op amp 30 at the second input 44.

The comparator 40 outputs a first voltage (e.g., approximately 0 volts) when the object 20 does not move relative to the capacitive sensor 12 and outputs a second voltage (e.g., approximately 3 volts) when the object 20 moves relative to the capacitive sensor 12. For example, the comparator 40 (1) outputs the first voltage when the output 36 of the feedback op amp 30 is less than the voltage bias 48 applied to the first input 42 of the comparator 40 and (2) outputs the second voltage when the output 36 of the feedback op amp 30 is greater than or equal to the voltage bias 48 applied to the first input 42 of the comparator 40.

The second voltage may be output when the object 20 moves away from the capacitive sensor 12. That is, the second voltage may not be output when the object 20 moves towards the capacitive sensor 12.

Figure 3:
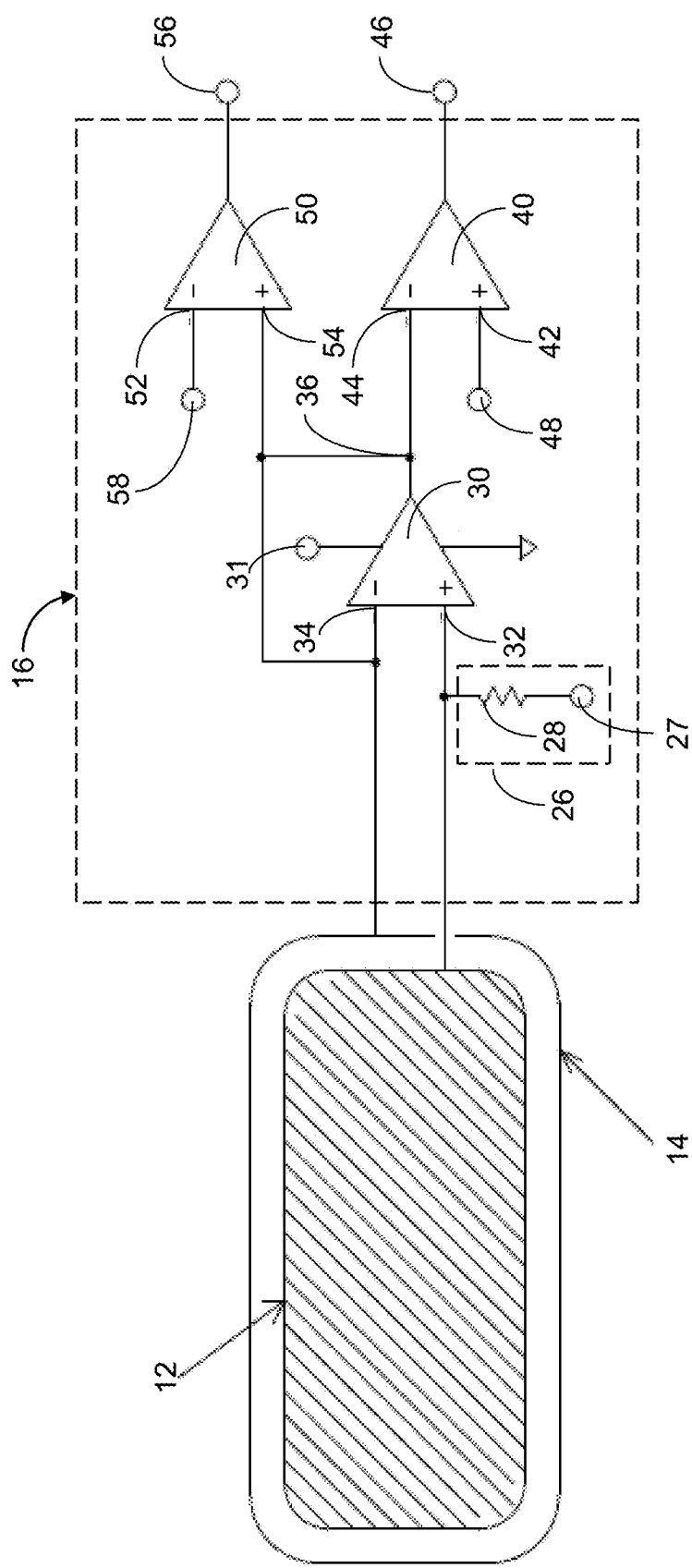
FIG. 3 is a circuit diagram of another exemplary proximity sensor.

Turning to FIG. 3, the circuitry 16 may additionally include a following comparator 50 having a first input (e.g., a non-inverting input 54), a second input (e.g., an inverting input 52), and an output 56. The following comparator 50 receives the output 46 of the feedback op amp 40 at the first input 54 and a voltage bias 58 at the second input 52. The following comparator 50 outputs a first voltage when the object 20 does not move relative to the capacitive sensor 12 and outputs a second voltage when the object 20 moves closer to the sensor 12.

The voltage bias 58 at the second input 52 of the following comparator 50 may differ from the voltage bias 48 at the non-inverting input 42 of the comparator. In this way, by using a comparator 40 and a following comparator 50, the proximity sensor 10 may have three different output signals: one output signal when the object 20 does not move relative to the capacitive sensor 12, a second output signal when the object moves towards the capacitive sensor 12, and a third output signal when the object moves away from the capacitive sensor 12. For example, the second output signal may be a positive voltage and the third output signal may be a negative voltage.

Figure 4:
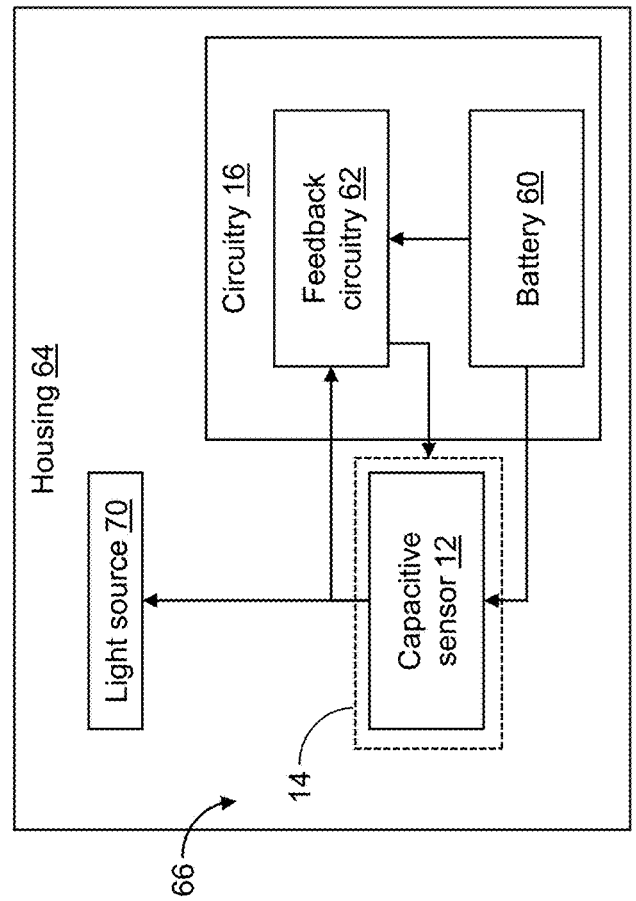
FIG. 4 is a schematic view of an exemplary proximity sensor including a battery and light source.

Turning to FIG. 4, the circuitry 16 may include at least one battery 60 and feedback circuitry 62. For example, the feedback circuitry 62 includes the feedback op amp 30, the comparator 40, and the following comparator 50. In a preferred embodiment, the battery(ies) 60 supplies all electrical power to the capacitive sensor 12, the guard ring 14, and the circuitry 16. As will be understood by one of ordinary skill in the art, the battery(ies) 60 may comprise a single battery or several batteries in parallel and/or series.

The proximity sensor 10 may also include a housing 64 having an interior volume 66. The housing 64 may contain entirely within the interior volume 66 the capacitive sensor 12, the guard ring 14, the circuitry 16, and the battery(ies) 60.

The proximity sensor 10 may also include a light source 70 (e.g., one or more light emitting diodes). For example, the light source may be contained within the housing 64. The circuitry 16 outputs a voltage or current when the movement of the object 20 is detected and the outputted voltage or current may be applied to the light source 70, such that the light source 70 emits light upon detecting movement of the object 20.

The proximity sensor 10 including the light source 70 may be used to sense when a car door is opened and turn on the light source 70 (e.g., in the door sill). As will be understood by one of ordinary skill in the art, the proximity sensor 10 may be used in any device or system to sense movement of an object and cause a notification signal to be generated.

Returning to FIG. 1, the capacitive sensor 12 may be surrounded on all but one side by the guard ring 14. The non-surrounded side 13 of the capacitive sensor 12 faces a detection direction 15 and the capacitive sensor 12 is sensitive to the movement of the object 20 relative to the sensing direction 15.

The guard ring 14 may comprise a conductive material (e.g., a sheet or ring) placed between the capacitive sensor 12 and any objects in a non-sensing direction from the capacitive sensor 12. To electrically isolate the capacitive sensor 12 and guard ring 14 there may be a space or gap between the capacitive sensor 12 and guard ring 14. Alternatively, there may be an insulating layer positioned between the capacitive sensor 12 and the guard ring 14. Alternatively or additionally, there may be a metallic layer positioned between the capacitive sensor 12 and the guard ring 14. The metallic layer may reduce the sensing of movement from directions other than the sensing direction 15.

The guard ring 12 may also be called a driven ring or a driven shield. The guard ring 12 may be formed of a conducting material (e.g., nickel, titanium, platinum, gold, aluminum, poly-silicon, or another metal or other conducting material) or a combination of various conducting materials. The guard ring 12 may be formed from the same conducting material as the capacitive sensor 12. The guard ring 14 may be a floating electrode that is electrically isolated from the capacitive sensor 12.

As will be understood by one of ordinary skill in the art, the guard ring 14 may take any suitable shape and is not limited to a ring. For example, the guard ring 14 may comprise an open cube as shown in FIG. 1.

The transitional words or phrases, such as "comprising," "including," "carrying," "having," "containing," "involving," "holding," and the like, are open-ended, i.e., meaning including but not limited to.

Although the invention has been shown and described with respect to a certain embodiment or embodiments, equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A non-contact proximity sensor configured to provide an output indicating movement of an object relative to the proximity sensor, the proximity sensor comprising:
a guard ring;
a capacitive sensing electrode decoupled from a surrounding environment by the guard ring; and
circuitry configured to:
apply a direct current (DC) voltage to the capacitive sensing electrode, wherein the DC voltage applied to the capacitive sensing electrode charges the capacitive sensing electrode to a voltage potential;
apply a voltage to the guard ring based on the voltage applied to the capacitive sensing electrode using feedback, wherein the feedback has a gain between zero and one;
wherein the capacitive sensing electrode is configured such that the movement of the object relative to the capacitive sensing electrode changes a charge on the capacitive sensing electrode;
wherein the circuitry is configured to provide the output having a first value when the object does not move relative to the capacitive sensing electrode and another value when the object moves relative to the capacitive sensing electrode;
wherein the circuitry includes a feedback op amp incorporating the feedback;
wherein the feedback op amp is configured to receive as an input a voltage of the capacitive sensing electrode;
wherein an output of the feedback op amp is applied to the guard ring;
wherein the circuitry further comprises a comparator including a first input, a second input, and an output, the comparator configured to:
receive a voltage bias at the first input of the comparator;
receive the output of the feedback op amp at the second input of the comparator;
output a first voltage when the object does not move relative to the capacitive sensing electrode; and
output a second voltage when the object moves relative to the capacitive sensing electrode.

2. The proximity sensor of claim 1, wherein the output of the feedback op amp represents the voltage on the capacitive sensing electrode.

3. The proximity sensor of claim 2, wherein the output of the feedback op amp differs based on a size of the object that moves relative to the capacitive sensing electrode.

4. The proximity sensor of claim 2, wherein the change in charge on the capacitive sensing electrode caused by the movement of the object results in a change in voltage at the input of the feedback op amp.

5. The proximity sensor of claim 4, wherein the change in voltage at the input of the feedback op amp appears at the output of the feedback op amp.

6. The proximity sensor of claim 1, wherein the second voltage is output when the object moves away from the capacitive sensing electrode.

7. The proximity sensor of claim 6, the circuitry further comprising a following comparator comprising a first input, a second input, and an output, the following comparator configured to:
receive the output of the feedback op amp at the first input of the following comparator;
receive a voltage bias at the second input of the following comparator;
output a first voltage when the object does not move relative to the capacitive sensing electrode; and
output a second voltage when the object moves closer to the sensor.

8. The proximity sensor of claim 7, wherein the voltage bias at the second input of the following comparator differs from the voltage bias at the first input of the comparator.

9. The proximity sensor of claim 1, wherein the circuitry includes at least one battery configured to supply all electrical power supplied to the guard ring, the capacitive sensing electrode, and the circuitry.

10. The proximity sensor of claim 9, further comprising a housing containing entirely within an interior volume of the housing the at least one battery, the capacitive sensing electrode, the circuitry, and the guard ring.

11. The proximity sensor of claim 1, wherein the circuitry outputs a voltage or current when the movement of the object is detected and the outputted voltage or current is applied to a light source, such that the light source emits light upon the movement of the object being detected.

12. The proximity sensor of claim 1, wherein the capacitive sensing electrode is surrounded on all but one side by the guard ring.

13. The proximity sensor of claim 12, wherein the non-surrounded side of the capacitive sensing electrode faces a detection direction and the capacitive sensing electrode is sensitive to the movement of the object relative to the sensing direction.

14. The proximity sensor of claim 12, further comprising an insulating layer positioned between the capacitive sensing electrode and the guard ring.

15. The proximity sensor of claim 14, further comprising a metallic layer positioned between the capacitive sensing electrode and the guard ring, wherein the metallic layer is configured to reduce sensing of movement from directions other than the sensing direction.

16. The proximity sensor of claim 1, wherein the circuitry drives the guard ring to have a voltage potential that is:
less than a voltage potential of the capacitive sensing electrode; and
within one percent of the voltage potential of the capacitive sensing electrode.

17. The proximity sensor of claim 1, wherein the circuitry is configured to charge the voltage potential of the capacitive sensing electrode to 1.5 volts.

\* \* \* \* \*